United States Patent
Jimarez et al.

(10) Patent No.: US 6,734,368 B1
(45) Date of Patent: May 11, 2004

(54) METAL BACKED PRINTED CIRCUIT BOARD ASSEMBLIES

(75) Inventors: Lisa J. Jimarez, Newark Valley, NY (US); David N. Light, Los Gatos, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 08/890,582

(22) Filed: Jul. 9, 1997

(51) Int. Cl.[7] .................................................. H05K 1/03
(52) U.S. Cl. ...................... 174/255; 174/254; 174/259; 29/829; 438/413
(58) Field of Search ................................. 174/259, 254, 174/261, 255; 29/829, 832; 428/209, 901; 361/767; 438/413

(56) References Cited

U.S. PATENT DOCUMENTS

| | | | | |
|---|---|---|---|---|
| 4,616,413 A | * | 10/1986 | Iliou et al. ..................... | 29/832 |
| 4,667,401 A | * | 5/1987 | Clements et al. ............. | 29/832 |
| 5,210,941 A | | 5/1993 | Turek et al. ................... | 29/852 |
| 5,296,074 A | * | 3/1994 | Graham et al. ............... | 29/832 |
| 5,376,403 A | | 12/1994 | Capote et al. ................ | 427/96 |
| 5,538,789 A | * | 7/1996 | Capote et al. ............... | 428/413 |
| 5,543,585 A | * | 8/1996 | Booth et al. ................. | 361/767 |
| 5,565,267 A | | 10/1996 | Capote et al. ............... | 428/344 |

* cited by examiner

Primary Examiner—Albert W. Paladini
(74) Attorney, Agent, or Firm—Arthur J. Samodovitz

(57) ABSTRACT

A method for conductively bonding a printed circuit board to a metal back plate is provided. The method includes the steps of providing a dielectric substrate that is metallized on its two faces; providing a metallic back plate; and bonding the metallic back plate to one of the metallized faces of the substrate using an electrically conductive adhesive that includes an adhesive polymer and at least one conductive metal having an electromagnetic force (EMF) that is equal to or less than one volt. The present invention also relates to a printed circuit board assembly which includes printed circuit board which includes a dielectric substrate having a first circuitized metallic layer disposed on one opposing face of the substrate and a second metallic layer disposed on the other opposing face of said substrate; a metal back plate; and an electrically conductive bonding layer disposed between the plate and the second metallic layer of the printed circuit board. The electrically conductive bonding layer contains an adhesive polymer and a conductive metal having an EMF that is less than one volt. The electrically conductive bonding layer is substantially free of silver.

24 Claims, 1 Drawing Sheet

METAL BACKED PRINTED CIRCUIT BOARD ASSEMBLIES

BACKGROUND OF THE INVENTION

This invention relates to a metal backed printed circuit board assembly having an improved conductive interconnection between the printed circuit board and the metal back plate thereof.

In many applications, such as cellular systems, personal communication systems, and land-based communication systems, printed circuit boards are connected to metal back plates to provide a metal-backed printed circuit board assembly. The metal back plate may be bonded to one surface of a thin, flexible, printed circuit board to rigidify the board and thus, make the resulting assembly easier to handle. The metal back plate may also act as a sink for dissipating the heat that is generated when additional components are soldered to the opposite circuitized surface of the printed circuit board, thereby preventing damage to the circuitry. In some applications the metal plate also acts as an electrical ground plane.

Several methods have been used to connect the metal back plate to the printed circuit card. One method involves soldering the printed circuit board onto the metal back plate. This method provides a conductive interconnection between the entire adjoining surfaces of the printed circuit board and the metal back plate. Unfortunately, the soldering process can cause flux to become entrapped between the metal back plate and the printed circuit board. Since flux is corrosive, it will eventually degrade the conductive interconnection. Sweat soldering is difficult to achieve without entrapping air and creating voids in the conductive interconnection. The presence of voids disrupts localized grounding, and in some cases can degrade the system's electrical performance. Sweat soldering also subjects the printed circuit board to significant thermal stress, which can increase fatigue of critical structures in the board and decrease product lifetime. Sweat soldering is also a costly manufacturing process. Moreover, the soldered bond is relatively non-compliant. In addition, the assembly tends to develop defects due to CTE mismatches during subsequent processing or use, thus rendering the mechanical and electrical connections between the printed circuit board and metal back plate unreliable and prone to failure.

Simple mechanical interconnections such as screws or rivets may also be used to connect the printed circuit board to the metal back plate. However, imperfect coplanarity between the printed circuit board and the metal back plate coupled with localized thermal stresses tend to cause development of localized areas of non-contact between the printed circuit board and metal back plate. Accordingly, the interconnection between the printed circuit board and the plate does not remain global and can, in fact, vary significantly with time. Moreover, the resistance across the interface between the printed circuit board and the metal plate tends to increase over time, which may lead to failure of the assembly.

Another method employs a conductive adhesive which is heavily loaded with conductive particles, particularly silver particles, thereby creating conductive paths that carry current from the printed circuit board to the metal back plate. The printed circuit board assemblies made with some of these adhesives initially have a low bulk resistivity. Unfortunately, however, the metal back plate of such adhesively-bonded assemblies tend to corrode, readily under conditions of high humidity and elevated temperatures. This problem is especially troublesome when the metal back plate is made of aluminum and the conductive adhesive contains a non-noble metal, such as silver. The corrosive products that are formed at the interface between the conductive adhesive and the metal back plate ultimately can lead to electrical and mechanical instability and failure of the bonding between the printed circuit board and the metal back plate.

Accordingly, it is desirable to have an improved method of conductively bonding a printed circuit board to a metal back plate. A method that produces a printed circuit board assembly in which the mechanical and electrical connections between the printed circuit board and the metal back plate remain stable even when the assembly is subjected to humid environments over extended periods of time is especially desirable

SUMMARY OF THE INVENTION

In accordance with the present invention, a method for conductively bonding a printed circuit board to a metal back plate is provided. The method comprises providing a dielectric substrate that is metallized on its two faces; providing a metallic back plate; and bonding the metallic back plate to one of the metallized faces of the substrate using an electrically conductive adhesive that comprises a polymeric adhesive and at least one conductive metal having an electromotive force (EMF) that is less than one (1) volt. Preferably, the adhesive is substantially free of conductive metals having an EMF of 1.0 volt or greater.

The present invention also relates to a printed circuit board assembly comprising a printed circuit board comprising a dielectric substrate having a first circuitized metallic layer disposed on one opposing face of the substrate and a second metallic layer disposed on the other opposing face of said substrate; a metal back plate; and an electrically conductive bonding layer disposed between the plate and the second metallic layer of the printed circuit board. The electrically conductive bonding layer comprises a polymeric adhesive and a conductive metal having an EMF that is less than one volt. The electrically conductive bonding layer is substantially free of silver.

In accordance with the present invention, it has been discovered that employing a conductive adhesive that comprises conductive metal particles having an EMF of less than one volt to bond a printed circuit board to a metal back plate can reduce or even eliminate the increase in electrical resistance that occurs at the interface between the adhesive and the metal plate when the printed board assembly is subjected to temperature fluctuations and/or humid conditions.

DETAILED DESCRIPTION OF THE INVENTION

Figure 1:
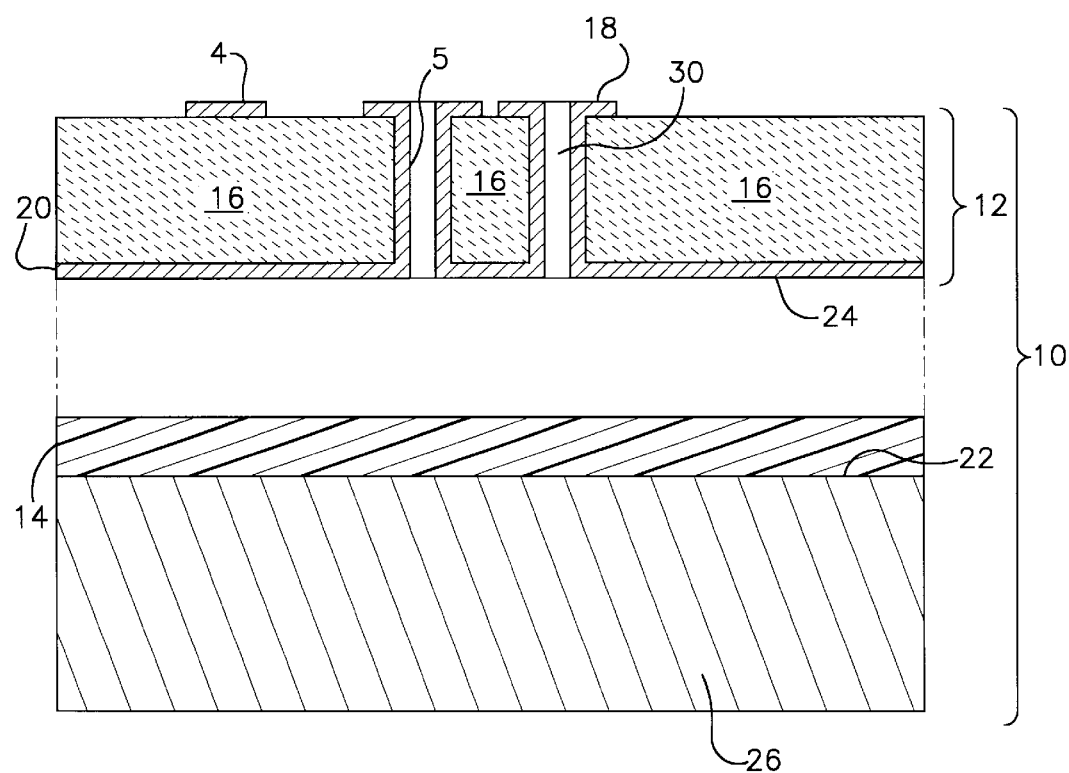
FIG. 1 is a partially-exploded cross-sectional view of a printed circuit board assembly constructed in accordance with the present invention.

In accordance with the present invention, a method of manufacturing a printed circuit board assembly comprising a printed circuit board conductively and mechanically bonded to a metal back plate is provided. The method employs a conductive adhesive that comprises a thermosetting or thermoplastic polymer and particles of at least one conductive metal that has an EMF of less than one volt, preferably less than zero volts. The particles of the conductive metal are dispersed throughout the polymer to provide electrically conductive paths between the printed circuit board and the metal back plate. Preferably, the conductive adhesive is substantially free of silver particles. More preferably, the adhesive is substantially free of metals that have an EMF greater than one volt. As used herein a conductive adhesive is substantially free of a metal when the respective metal comprises less than 10% by weight, preferably less than 2% by weight of the total weight of the adhesive.

It has been found that printed circuit board assemblies made in accordance with the present method have a more stable electrical resistance across the board when subjected to conditions of high humidity and/or temperature fluctuations than printed circuit board assemblies which employ a conductive adhesive impregnated with a metal, such as silver, that has an EMF greater than one volt. The present method also provides a printed circuit board assembly having a more durable mechanical connection between the printed circuit board and the metal back plate than printed board assemblies made with conductive adhesives that are heavily loaded with metallic particles having an EMF greater than one volt.

The Printed Circuit Board Assembly

The printed circuit board that is bonded to the metal back plate comprises a dielectric substrate metallized on two opposing faces of the substrate. Examples of materials which are used to form such underlying substrates include for example epoxy-based resins, epoxy resins reinforced with woven fiberglass, non-epoxy thermoset resins, polyimides and, preferably, polytetrafluororethylene reinforced with woven fiberglass, chopped glass, or ceramic filler. The reinforced polytetrafluoroethylene substrate material is available from Arlon of Bear, Del., Tactonic Plastics of Petersburg, N.Y., and Rogers Corp. of Rogers, Conn. The substrates have a highly conductive metal, such as copper, plated on opposing faces thereof. Preferably, the metallic plating on one surface is patterned to form printed wiring for electrically connecting electronic components that are to be mounted to the circuit board. Preferably, a protective coating formed from a metal that is relatively resistant to corrosion, such as for example, tin, tin-lead, or gold is plated over the highly conductive copper plating to prevent the highly conductive metallic plating from oxidizing or developing a film coating of impurities.

The metal back plate may be made from any metal that conducts heat and electricity, such as copper, brass and aluminum. Preferably the metal back plate is made from aluminum due to advantages in cost and weight. Typically, the metal back plate is at least as wide and as long as the printed circuit board and configured to substantially conform thereto so that a secure bond can be created between the surfaces of the printed circuit board and the metal back plate.

However, the metal back plate may be larger or smaller than the printed circuit board. The thickness of the metal back plate depends upon the application. Typically, the metal back plate has a thickness of between 0.03 and 0.5 inches.

Between the printed circuit board and the metal back plate is an electrically-conductive bonding layer comprising a cured, thermoset or thermoplastic polymer that is impregnated with a conductive metal having an EMF of less than one volt (referred to hereinafter as a "low EMF metal"). Suitable thermoset polymers for forming the bonding layer include for example acrylics, silicones, and, preferably, epoxy-based polymers. Suitable thermoplastic polymers for forming the bonding layer include, for example, polyhydroxyethers. Suitable low EMF metals for inclusion in the polymer include for example, iron, nickel, chorme or zinc. Typically, the metal is in the form of flakes, particles, or powders that are dispersed throughout the polymer resin to provide electrically conductive paths throughout the adhesive. As used hereinafter the term "particles" encompasses flakes and powders as well as particles. Preferably the adhesive used to make the bonding layer comprises the low EMF metal at a weight which is from about 35% to 90%, more preferably 45% to 90%, most preferably 60% to 90% by weight of the total adhesive weight. The electrically conductive bonding layer is substantially free of a silver. A bonding layer is substantially free of a metal if it contains less than 10% preferably less than 2%, by weight of the total weight of the bonding layer. Preferably, the bonding layer is also substantially free of other metals, having an EMF greater than one volt, such as for example gold, platinum, palladium, iridium, rhodium, mercury, ruthenium, rhenium and osmium. If the printed circuit board and metal back plate have similar coefficients of thermal expansion ("CTE"), it is preferred that the CTE of the adhesive that is used to form the bonding layer be closely matched to the CTE of the printed circuit board and metal back plate, i.e the CTE of the adhesive that is used to form the bonding layer has a CTE within 20 to 40 ppm/° C. of the CTE of the printed circuit board and metal back plate. If the printed circuit board and metal back plate differ substantially in CTE, it is preferred that the adhesive have a CTE intermediate the CTEs of the printed circuit board and metal back plate. If the printed circuit board and metal back plate differ substantially in CTE, it is also preferred that the adhesive have a low modulus of elasticity.

Method of Preparation.

The adhesive can be applied to either the metallized connection surface of the printed circuit board, or to the connection surface of the metal back plate, or to both. The adhesive may be in the form of a film or a paste. A preferred adhesive is the nickel-loaded, epoxy-based, paste adhesive EG9090 by Al Technologies, Lawrenceville, N.J. To achieve uniform coverage over a large area, it is preferred that the adhesive, in paste form, be applied to the connection of the metal back plate by a conventional screening process. However, other methods, such as stenciling are acceptable. Preferably, the thickness of the adhesive layer is in the range of 2.4 to 3.0 mil, more preferably 2.6 to 2.8 mil, to effectuate a thin, continuous, stress-resistant bonding layer of adhesive between the connection surfaces.

Prior to application of the adhesive, it is preferred that the connection surface, i.e the surface that is to be placed in contact with the adhesive, be first degreased and then micro-roughened by a vapor-grit blast. Also, it is preferred that the metallized connection surface of the printed circuit board be cleaned and the oxide layers which are present on the metallic layers be removed therefrom. After these pre-connection treatments are completed, the electrically-conductive low EMF metal-containing adhesive is dispensed and the printed circuit board and metal back plate are clamped together under pressure to form a printed board assembly having a printed circuit board/adhesive bond/metal back plate interface. The assembly is then heated to cure the adhesive, resulting in the formation of a metal-backed printed board assembly comprising a printed circuit board that is stably interconnected mechanically, thermally, and electrically to the metal back plate.

One embodiment of a printed circuit board assembly produced in accordance with the present method is illustrated in FIG. 1. The printed circuit board assembly, shown generally as 10, comprises a printed circuit board, shown generally as 12, a bonding layer 14, and a metal back plate 26. Connection surface 22 of the metal back plate 26 is attached to connection surface 24 of printed circuit board 12 by bonding layer 14. Printed circuit board 12 comprises a dielectric substrate 16 metallized on two opposing faces of the substrate. Copper circuitry 18, which is formed on one opposing face of dielectric substrate 16, is connected to a copper ground plane 20 on the other opposing face of dielectric substrate 16 via a plated through-hole 30. Bonding layer 14 is formed from an electrically conductive and thermally conductive adhesive comprising an epoxy-based polymer, an acrylic polymer, or a thermoplastic polymer and a conductive metal having an EMF of less than one volt, preferably of less than zero volts.

The following non-limiting examples are presented to further illustrate the present invention.

EXAMPLE 1

A printed circuit board assembly was made using the nickel particle-filled, epoxy-based adhesive EG9090 available from AI Technologies. Prior to application of the adhesive, the connection surface of the aluminum back plate was degreased with isopropyl alcohol, and vapor-grit blasted with a titanium oxide abrasive. The adhesive was then applied to the treated surface of the aluminum back plate at a thickness of approximately 2.6 to 2.8 mil using a conventional screening process. Prior to contact with the adhesive, contaminants were removed from the connection surface of the printed circuit board and a passivation layer was applied. Following this treatment, the connection surface of the printed circuit board was placed in contact with the adhesive and the resulting composite clamped together using a spring-loaded device. The resulting composite was then introduced into an infra-red ("IR") oven from Radiant Technologies, Inc., by being placed on a conveyor belt that was moving at a belt speed of 7 inches per minute. In the IR oven the resulting composite was heated to a temperature of 120° C. and maintained at this temperature for approximately 5 minutes to cure the adhesive and to provide a printed board assembly in which the printed circuit board was mechanically bonded and electrically interconnected to the aluminum back plate.

Comparative Example

A printed circuit board assembly was made as described in example 1 except that the silver flake-filled, epoxy-based, adhesive 8175 from Ablestik, Rancho Dominguez, Calif. was used. The adhesive was applied at a thickness of 2.6 to 3.0 mils and cured at a temperature of 150° C. for 30 minutes. In addition, the composite of printed circuit board, aluminum back plate and adhesive was introduced into the IR oven at a belt speed of 3 inches per minute.

Characterization of the Printed Board Assemblies of Example 1 and the Comparative Example The printed board assemblies of example 1 and the comparative example were placed in a chamber maintained at 85° C. and 80% relative humidity to determine the effect of high humidity conditions on the electrical properties and mechanical properties of these assemblies. Resistance was measured for periods of up to 1000 hours. The results are shown in Table 1.

TABLE 1

Resistance prior to and following exposure to a high humidity environment.

| Printed Circuit Board Assembly | Resistance (mohm) | | |
| --- | --- | --- | --- |
| | 0 hour | 500 hr. | 1000 hr. |
| Example 1 | 0.60 (mean) | 0.77 (min) 0.99 (mean) 1.54 (max) | 0.96 (min) 1.24 (mean) 1.98 (max) |
| Comparative Example | 0.47 (mean) | 1.34 (min) 1.98 (mean) 3.10 (max) | 2.18 (mean) |

As shown in Table 1, the initial resistance of both examples were quite similar. The resistance of the printed board assembly of example 1 remained relatively constant throughout the entire test period. The resistance of the printed circuit board assembly of example 1 merely doubled, increasing from a mean value of 0.60 mohm prior to exposure to the high humidity environment to a mean value of 1.24 mohm at the end of the 1000 hour exposure. In contrast, the resistance of the printed board assembly of the comparative example increased rapidly from a value of 0.47 mohm prior to exposure to the high humidity environment to a mean value of 1.98 mohm within 500 hours after the assembly was introduced into the high humidity environment. Moreover, previous tests had shown that the resistance of printed board assemblies made in accordance with the method described in the comparative example increased to a greater extent than the resistance of printed circuit board assemblies prepared as described in example 1. These results show that printed board assemblies that employ a thermoset polymer-based adhesive impregnated with a conductive metal having an EMF less than one volt to connect the printed circuit board to the metal back plate have a more stable conductive bond than printed circuit board assemblies that employ a conductive adhesive in which the metal filler has an EMF of greater than one volt.

At the end of 1000 hours, attempts were also made to manually pull apart the printed circuit board and the metal back plate of the printed board assemblies of example 1 and the comparative example. The printed board assemblies of the comparative example came apart with little effort. In many instances, the printed board assemblies of example 1 could not be pulled apart by persons of average strength unless the assemblies were first stabilized by placement in a vice. These results show that printed board assemblies that employ a thermoset polymer-based adhesive impregnated with a conductive metal having an EMF of less than one volt to connect the printed circuit board to the metal back plate have a more durable mechanical bond than printed circuit board assemblies that employ a conductive adhesive in which the metal filler has an EMF greater than one volt.

Visual observation of the assemblies that were pulled apart following the 1000 hour exposure to the 80% relative humidity, 85° C. environment demonstrated that the metal back plate of the printed circuit board assembly of the comparative example had a thick, pink layer of aluminum oxide on the connection surface thereof. Such layers are characteristic of aluminum hydrolysis. In contrast, there was no visible change in the appearance of the connection surface of the metal back plate of the printed circuit board assembly of example 1. Thus, there was no evidence of aluminum oxide formation or aluminum hydrolysis when the printed circuit board assemblies were made using a conductive adhesive that comprises a low EMF electrically-conductive metal.

While the invention has been described to some degree of particularity, various adaptations and modifications can be made without departing from the scope of the invention as defined in the appended claims.

What is claimed is:

1. A printed circuit board assembly comprising:
   a) a printed circuit board comprising a dielectric substrate, a metallic circuitization disposed on one face of said substrate, and a metallic layer disposed on another, opposite face of said substrate;
   b) a metal back plate having a connection surface; and
   c) a bonding layer bonding the metallic layer of said printed circuit board to the connection surface of said metal back plate; said bonding layer comprising an adhesive polymer and a conductive metal having an EMF of less than zero volts, said conductive metal being dispersed throughout said polymer; said conductive metal being present at a weight of from about 45% to about 90% by weight of the total bonding layer weight; said polymer selected from the group consisting of an acrylic polymer, an epoxy-based polymer and a thermoplastic polymer, a thickness of said bonding layer being in a range of 2.4 to 3.0 mils.

2. The printed circuit board assembly of claim 1 wherein said conductive metal is from about 60% to about 90% by weight of the total bonding layer weight.

3. The printed circuit board assembly of claim 2 wherein the conductive metal is nickel.

4. The printed circuit board assembly of claim 2 wherein the bonding layer is substantially free of silver.

5. The printed circuit board assembly of claim 2 wherein the bonding layer is substantially free of a metal having an EMF greater than one volt.

6. The printed circuit board assembly of claim 2 wherein the bonding layer is substantially free of a metal selected from the group consisting of silver, gold, platinum, palladium, iridium, rhodium, mercury and osmium.

7. The printed circuit board assembly of claim 1 wherein said bonding layer is substantially free of a metal selected from the group consisting of silver, gold, platinum, palladium iridium, rhodium, mercury and osmium.

8. The printed circuit board assembly of claim 1 wherein said bonding layer is substantially free of a metal having an EMF greater than one volt.

9. The printed circuit board assembly of claim 1 wherein the adhesive polymer is an epoxy-based polymer.

10. The printed circuit board assembly of claim 9 wherein the conductive metal is selected from the group consisting of nickel, chromium and zinc.

11. The printed circuit board assembly of claim 1 wherein the conductive metal is selected from the group consisting of nickel, chromium and zinc.

12. The printed circuit board assembly of claim 11 wherein the conductive metal is nickel.

13. The printed circuit board assembly of claim 1 wherein the metal back plate comprises aluminum and wherein the printed circuit board assembly is more resistant to aluminum hydrolysis under conditions of high humidity than a printed circuit board assembly in which the bonding layer comprises an electrically-conductive adhesive containing silver.

14. The printed circuit board assembly of claim 1 wherein the thickness of said bonding layer is in a range of 2.6–2.8 mils.

15. The printed circuit board assembly of claim 1 wherein said metal back plate is aluminum.

16. The printed circuit board of claim 1 wherein said metal back plate is electrically grounded via said second metallic layer and said bonding layer.

17. A method for forming a printed circuit board assembly comprising the steps of:
   a) providing a printed circuit board comprising a metal layer;
   b) providing a metal back plate having a surface;
   c) bonding the surface of said metal back plate to the metal layer of said printed circuit board using an adhesive comprising:
      i) an epoxy-based adhesive polymer; and
      ii) a conductive metal having an EMF of less than zero volts, wherein said conductive metal is dispersed throughout said polymer to provide a conductive adhesive:
   and wherein said conductive metal is present at a weight of from about 45% to about 90% by weight of the total bonding layer weight, a thickness of said adhesive being in a range of 2.4 to 3.0 mils.

18. The method of claim 17 wherein said adhesive is substantially free of a metal having an EMF of greater than one volt.

19. The method of claim 17 wherein said adhesive comprises a conductive metal selected from the group consisting of nickel, iron, zinc, and chromium.

20. The method of claim 17 wherein said adhesive comprises nickel and is substantially free of silver.

21. The method of claim 17 wherein the conductive metal is present at a weight of from about 60% to 90% by weight of the adhesive weight.

22. The method of claim 21 wherein the adhesive comprises a conductive metal selected from the group consisting of nickel, zinc, and chromium.

23. The method of claim 21 wherein the adhesive is substantially free of silver.

24. The method of claim 17 wherein the metal back plate comprises aluminum and wherein the method provides a printed circuit board assembly which is more resistant to aluminum hydrolysis under conditions of high humidity than a printed circuit board assembly in which the bonding layer comprises an electrically-conductive adhesive containing silver.

* * * * *